United States Patent
Mizuno et al.

(10) Patent No.: US 11,501,974 B2
(45) Date of Patent: Nov. 15, 2022

(54) ELECTRODE STRUCTURE OF BACK ELECTRODE OF SEMICONDUCTOR SUBSTRATE, METHOD FOR PRODUCING THE SAME, AND SPUTTERING TARGET FOR USE IN PRODUCING THE ELECTRODE STRUCTURE

(71) Applicant: TANAKA KIKINZOKU KOGYO K.K., Tokyo (JP)

(72) Inventors: Yohei Mizuno, Tomioka (JP); Tetsuya Kato, Tomioka (JP); Chiharu Ishikura, Tomioka (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 271 days.

(21) Appl. No.: 16/471,174

(22) PCT Filed: Dec. 19, 2017

(86) PCT No.: PCT/JP2017/045551
§ 371 (c)(1),
(2) Date: Jun. 19, 2019

(87) PCT Pub. No.: WO2018/117104
PCT Pub. Date: Jun. 28, 2018

(65) Prior Publication Data
US 2019/0393043 A1  Dec. 26, 2019

(30) Foreign Application Priority Data

Dec. 22, 2016  (JP) .............................. JP2016-249100

(51) Int. Cl.
*H01L 21/285* (2006.01)
*H01L 29/40* (2006.01)
(Continued)

(52) U.S. Cl.
CPC .......... *H01L 21/28568* (2013.01); *C22C 5/06* (2013.01); *C23C 14/14* (2013.01); *C23C 14/5806* (2013.01); *H01J 37/3426* (2013.01); *H01L 29/401* (2013.01); *H01L 29/41741* (2013.01); *H01L 29/45* (2013.01)

(58) Field of Classification Search
None
See application file for complete search history.

(56) References Cited

U.S. PATENT DOCUMENTS

2008/0217640 A1* 9/2008 Suzuki .................. H01L 33/405
257/98
2015/0255906 A1  9/2015 Shibuya et al.

FOREIGN PATENT DOCUMENTS

JP  2003-347487 A  12/2003
JP  2004-186438 A  7/2004
(Continued)

OTHER PUBLICATIONS

Extended European Search Report dated Feb. 12, 2020 for corresponding Application No. 17882299.5.
(Continued)

*Primary Examiner* — Erik Kielin
(74) *Attorney, Agent, or Firm* — Foley & Lardner LLP

(57) ABSTRACT

An electrode structure of a back electrode including metal layers laminated in the following order: a Ti layer, a Ni layer, and a Ag alloy layer. The Ag alloy layer includes an Ag alloy and an addition metal M selected from Sn, Sb, and Pd. The electrode structure is configured such that when subjected to elemental analysis with an X-ray photoelectron spectrometer in the depth direction from the Ag alloy layer to the Ni layer, on the boundary between the Ni layer and the Ag alloy layer, an intermediate region where spectra derived from all the metals, Ni, Ag, and the addition element M, can be detected is observable, and, when each metal content in the intermediate region is converted based on the spectra (Continued)

derived from all the metals Ni, Ag, and the addition element M, the maximum of the addition element M content is 5 at % or more.

12 Claims, 3 Drawing Sheets

(51) Int. Cl.
*H01L 29/417* (2006.01)
*H01L 29/45* (2006.01)
*C22C 5/06* (2006.01)
*C23C 14/14* (2006.01)
*C23C 14/58* (2006.01)
*H01J 37/34* (2006.01)

(56) References Cited

FOREIGN PATENT DOCUMENTS

JP 2007-273744 A 10/2007
JP 2014-236043 A 12/2014

OTHER PUBLICATIONS

International Searching Authority, "International Search Report," issued in connection with International Patent Application No. PCT/JP2017/045551, dated Jan. 23, 2018.

International Searching Authority, "Written Opinion," issued in connection with International Patent Application No. PCT/JP2017/045551, dated Jan. 23, 2018.

* cited by examiner

US 11,501,974 B2

ELECTRODE STRUCTURE OF BACK ELECTRODE OF SEMICONDUCTOR SUBSTRATE, METHOD FOR PRODUCING THE SAME, AND SPUTTERING TARGET FOR USE IN PRODUCING THE ELECTRODE STRUCTURE

RELATED APPLICATIONS

The present application claims priority under 37 U.S.C. § 371 to International Patent Application No. PCT/JP2017/045551, filed Dec. 19, 2017, which claims priority to and the benefit of Japanese Patent Application No. 2016-249100, filed on Dec. 22, 2016. The contents of these applications are hereby incorporated by reference in their entireties.

TECHNICAL FIELD

The present invention relates to an electrode structure of a back electrode formed on a back surface of a semiconductor substrate of a semiconductor device, such as a power module. It particularly relates to a back electrode formed on a back surface of a semiconductor substrate and having a multilayer structure Ti layer/Ni layer/Ag alloy layer, which is excellent in bonding properties between the Ni layer and the Ag alloy layer and also in peel strength.

BACKGROUND ART

In a semiconductor device called a power module, such as MOSFET or IGBT, an electrode is installed on each of the front and back surfaces of a semiconductor substrate such as Si or SiC, thereby ensuring conduction in the vertical direction. As such a back electrode installed on the back surface of a semiconductor substrate, a multilayer-structured electrode formed of a laminate of a plurality of metal layers is generally applied.

The specific configuration of a back electrode is as follows. On a semiconductor substrate, a Ti layer for ensuring adhesion to the substrate and forming an electrical ohmic junction is formed, and, on the Ti layer, a Ni layer for ensuring bonding properties between the substrate and the solder upon mounting the semiconductor substrate is formed. Further, for improving the bonding properties of the Ni layer, in terms of preventing the surface oxidation of the Ni layer, a Ag layer is formed. As an example of a semiconductor device applying such a back electrode having a multilayer structure Ti layer/Ni layer/Ag layer, for example, the device described in Patent Document 1 can be mentioned. Incidentally, the electrode structure of a back electrode is basically the above three-layer structure. However, in some cases, a contact layer made of a metal having a low electronic barrier to Si forming the semiconductor substrate, such as Al, is additionally formed as an underlayer of the Ti layer.

RELATED ART DOCUMENT

Patent Documents

Patent Document 1: JP 2003-347487 A

SUMMARY OF THE INVENTION

Problems to be Solved by the Invention

In a power module and the like having mounted thereon a semiconductor substrate equipped with the above multilayer-structured back electrode, as the device size becomes smaller and smaller, the output power has also been increasing. With this tendency, the temperature of the mounted semiconductor device rises, and its durability has become a matter of concern. To deal with such a temperature rise in a semiconductor device, measures such as improvement in the heat dissipation properties of a heat sink mounted on the substrate have been examined, and improvement in the electrode structure is also expected to be effective.

As the direction of improvement in the electrode structure, in particular, in relation to the multilayer-structured back electrode described above, improvement in the adhesion between the Ni layer and the Ag layer has been a problem. According to studies made by the present inventors, in the course of using the module, delamination may occur between the Ni layer and the Ag layer, causing a failure. Also in the past, such electrode breakage due to delamination has been a phenomenon that can be a problem. However, in future semiconductor devices with higher output power, this phenomenon is expected to be an even more serious problem.

The present invention has been accomplished against the above background and relates to an electrode structure of a back electrode of a semiconductor substrate, which is resistant to electrode breakage delamination that occurs near the Ni layer. Further, a method for producing such an electrode structure will also be disclosed.

Means for Solving the Problems

The present invention that solves the above problems is an electrode structure of a back electrode formed on a back surface of a semiconductor substrate and having a multilayer structure including metal layers laminated in the following order from the semiconductor substrate: a Ti layer, a Ni layer, and a Ag alloy layer. The Ag alloy layer includes an alloy of Ag and an addition metal M selected from Sn, Sb, and Pd. The electrode structure of a back electrode is configured such that when the back electrode is subjected to elemental analysis with an X-ray photoelectron spectrometer in the depth direction from the Ag alloy layer to the Ni layer, on the boundary between the Ni layer and the Ag alloy layer, an intermediate region where spectra derived from all the metals, Ni, Ag, and the addition element M, can be detected is observable, and further, when the content (at %) of each metal in the intermediate region is converted based on the spectra derived from all the metals Ni, Ag, and the addition element M, the maximum of the content of the addition element M is 5 at % or more.

According to the present inventors, in terms of adhesion, the combination of Ni and Ag is not originally a preferred combination of metals. Usually, many metals have some adhesion when laminated by a thin-film production technology, such as a sputtering method, a vacuum deposition method, a plating method, or a CVD method. However, this does not necessarily apply to all combinations, and some combinations of metals are poor in adhesion. Also in the combination of Ni and Ag, immediately after the production of a back electrode by the above method, defects or delamination does not easily occur. However, because the combination is not originally a combination having high adhesion, delamination is likely to occur in a high-temperature atmosphere.

In the electrode structure of a back electrode according to the present invention, the material of a metal layer formed on the Ni layer is changed from Ag (pure Ag) to a Ag alloy containing a predetermined addition element M, and also the interfacial state between the Ni layer and the Ag alloy layer is appropriate. As a result of making such changes in material and structure to a back electrode, a back electrode having a multilayer structure resistant to delamination is obtained. Hereinafter, the back electrode according to the present invention will be described in more detail.

The electrode structure of the present invention includes a plurality of metal layers and is employed as a back electrode of a semiconductor substrate. The metal layers are laminated in the following order from the semiconductor substrate: Ti layer/Ni layer/Ag alloy layer. This order of lamination and the technical significance of the Ti layer and the Ni layer are basically the same as in conventional art.

In addition, the technical significance of the Ag alloy layer is also the same as in the conventional back electrode. In the present invention, Ag (pure Ag) is changed to a Ag alloy for the purpose of intentionally forming the below-described intermediate region to improve adhesion to the Ni layer. In addition, in the back electrode production process, the Ag alloy layer may act as a supply source of the element M in the intermediate region.

The Ag alloy layer is made of an alloy of Ag and the addition metal M selected from Ag, Sn, Sb, and Pd (Ag-M alloy). These three kinds of metals are applied because, according to specific studies made by the present inventor, these metals can be effective in ensuring adhesion to the Ni layer.

Further, in the electrode structure according to the present invention, on the boundary between the Ag alloy layer and the Ni layer, an intermediate region where the constituent elements of these metal layers coexist under specific conditions is observed. The intermediate region is a region where when the back electrode is subjected to elemental analysis with an X-ray photoelectron spectrometer (XPS) in the depth direction from the Ag alloy layer to the Ni layer, on the boundary of the Ni layer and the Ag alloy layer, all the spectra derived from Ni, Ag, and the addition element M are detected at the same time.

XPS is an analyzer that measures, based on the energy of photoelectrons released upon X-ray irradiation on a sample to be measured, the constituent elements of the sample and its electronic state (binding energy). Further, XPS is an analyzer capable of excellent qualitative analysis and quantitative analysis on the measurement site. In addition, in XPS, etching (sputtering with argon ions, etc.) and measurement on the sample are alternately repeated within the device, and the resulting spectral information is analyzed, whereby the composition/state of the sample in the depth direction can be evaluated.

Also in the present invention, when XPS is applied, spectra derived from all the metals of Ni, Ag, and the addition element M can be measured, and, based on them, the content (at %) of each metal in the intermediate region can be measured. In the intermediate region in the present invention, the spectra of Ni, Ag, and the addition element M each have an independent change, and the addition element M shows a change in the shape of a symmetric, approximately chevron-shaped curve.

Further, in the back electrode according to the present invention, it is necessary that the peak of the spectrum of the addition element M, which has the shape of a symmetric, approximately chevron-shaped curve, shows a maximum of 5 at % or more. When the maximum amount of the addition element M in the intermediate region is less than 5 at %, even when a Ag alloy layer is applied in place of pure Ag, the adhesion to the Ni layer is insufficient, causing the possibility of delamination. Further, when the maximum amount of the addition element M in the intermediate region increases from 5 at % or more, the delamination prevention effect of the Ag alloy layer increases. The maximum amount of the addition element M is preferably 7 at % or more. In addition, the upper limit of the maximum amount of the addition element M in the intermediate region is preferably 40 at % or less. Also when the content of the addition element M in the intermediate region is too high, the adhesion to the Ag alloy layer and the Ni layer may decrease. Incidentally, the thickness of the intermediate region is preferably 40 nm or more and 150 nm or less, and more preferably 70 nm or more and 150 nm or less.

Further, the addition element M is a metal element selected from Sn, Sb, and Pd. According to studies made by the present inventors, the delamination prevention effects of the Ag alloy layer are exhibited by such an addition element. In the case where such an addition element is present near the boundary between the Ag alloy layer and the Ni layer and forms the intermediate region together with Ag and Ni, adhesion is ensured.

The intermediate region described above is formed between the Ni layer and the Ag alloy layer of the back electrode. Here, the Ag alloy layer is a metal layer having the same function as a Ag layer in conventional art and prevents surface oxidation of the Ni layer. This Ag alloy layer is made of a Ag alloy containing the above addition element M in an amount of 1.5 at % or more and 4.5 at % or less. In addition, the thickness of the Ag alloy layer is preferably 50 nm or more and 1000 nm or less. When the thickness is less than 50 nm, the oxidation prevention effect of the Ni layer is insufficient, while a thickness of more than 1000 nm results in increased stress, possibly forming another cause of delamination from the Ni layer.

The Ag alloy layer is formed on the surface of the Ni layer. The technical significance of the Ni layer is, as in conventional art, for ensuring bonding properties with the solder upon mounting the semiconductor substrate. The thickness thereof is preferably 200 nm or more and 7000 nm or less.

Further, the Ni layer is formed on the surface of the Ti layer. The technical significance of the Ti layer is, as in conventional art, for improving adhesion to the substrate and establishing an electrical ohmic junction on the semiconductor substrate. The thickness of the Ti layer is preferably 20 nm or more and 1000 nm or less.

The back electrode having the electrode structure described above is formed on a back surface of a semiconductor substrate. A semiconductor substrate is made of a semiconductor such as Si, SiC, or GaN. In addition, it is also possible that a metal layer, such as Al, is formed as a contact layer on the semiconductor substrate, and the back electrode of the present invention (Ti layer/Ni layer/Ag alloy layer) is formed thereon.

Next, the method for producing an electrode structure of a back electrode of the present invention will be described. The method for producing a back electrode of the present invention is basically similar to a conventional method for producing a back electrode. That is, in the present invention, a Ti layer and a Ni layer are sequentially formed on a semiconductor substrate, and a Ag alloy layer is further formed. However, the present back electrode has an intermediate region between the Ni layer and the Ag alloy layer, and thus a step for its formation is required. Here, for the intermediate region formation process, some methods are viable.

There can be raised a method as a first one in which an electrode having a three-layer structure Ti layer/Ni layer/Ag alloy layer is produced first, and subsequently, an addition element M is supplied from the Ag alloy layer to the interface with the Ni layer, thereby forming an intermediate region. This method is useful in the case where the addition element M is Sn or Sb. That is, the method includes a step of forming a Ti layer on a back surface of a semiconductor substrate, a step of forming a Ni layer on the Ti layer, a step of forming a Ag alloy layer including a Ag alloy containing Sn or Sb in an amount of 2.0 mass % or more and 9.5 mass % or less on the Ni layer, and further, after forming the Ag alloy layer, a step of heating the substrate to 100° C. or more and 300° C. or less.

The Ti layer, the Ni layer, and the Ag alloy layer can be formed on the substrate with a general thin-film production technology, such as a sputtering method, a vacuum deposition method, a plating method, or a CVD method. The thickness can be controlled under known conditions in each process. The preferred method for forming each metal layer is a sputtering method.

In this method for producing a back electrode, after the Ag alloy layer is formed on the Ni layer, heating is performed to 100° C. or more and 300° C. or less, thereby supplying the addition element M to the Ni layer/Ag alloy layer interface. The reason why the heat treatment temperature is 100° C. or more and 300° C. or less is that when the temperature is less than 100° C., the addition element M is not sufficiently supplied to the intermediate region, while when the temperature is more than 300° C., the film inner structure changes, increasing the impact on the film surface roughness. Incidentally, the treatment time in the heat treatment is preferably 15 minutes or more and 120 minutes or less. The heat treatment atmosphere may be in the atmosphere, may be a reducing atmosphere or a non-oxidizing atmosphere, or may also be in vacuum.

Thus, the method for producing a back electrode including forming a Ag alloy layer on a Ni layer is useful in the case where the addition element M is Sn or Sb. This is because Sn or Sb is an element that moves relatively easily within a Ag alloy and thus can be appropriately supplied to the Ni layer/Ag alloy layer interface. Incidentally, in this method, the content of Sn or Sb in the Ag alloy layer to be formed is 2.0 mass % or more and 9.5 mass % or less for the purpose of making the maximum of the content of the addition element M in the intermediate region (value measured by XPS) 5 at % or more.

A second method for producing a back electrode is a method in which a Ti layer/Ni layer is formed, a metal layer of an addition element M is formed thereon, then a Ag layer is formed, and the layers are heat-treated to form an intermediate region while diffusing/releasing a part of the addition element M from the metal layer of the addition element M to the Ag layer. This method is useful in the case where the addition element M is Pd. That is, the method is a method for producing a back electrode, including: performing a step of forming a Ti layer on a back surface of a semiconductor substrate, and a step of forming a Ni layer on the Ti layer; forming a Pd thin film on the Ni layer, and then forming a Ag layer; and subsequently heating the substrate to 100° C. or more and 300° C. or less.

In this method for producing a back electrode, after the Pd layer and the Ag layer are formed on the Ni layer, heating is performed to 100° C. or more and 300° C. or less, thereby forming an intermediate region. In this heat treatment, Pd is diffused from the Pd layer into the Ag layer to form an intermediate region, and, at the same time, the Ag layer becomes a Ag alloy layer. The reason why the heat treatment temperature is 100° C. or more and 300° C. or less is that when the temperature is less than 100° C., the addition element M is not sufficiently diffused, while when the temperature is more than 300° C., the film inner structure changes, increasing the impact on the film surface roughness. Incidentally, the treatment time in the heat treatment is preferably 15 minutes or more and 120 minutes or less. The heat treatment atmosphere may be in the atmosphere, may be a reducing atmosphere or a non-oxidizing atmosphere, or may also be in vacuum.

The methods for forming a Ti layer, a Ni layer, and a Ag layer are the same as in the above first method. In addition, the Pd layer can also be formed by the same thin-film production technology. In this method, the thickness of the Pd layer is preferably 5 nm or more and 50 nm or less.

In the methods for producing a back electrode described above, in the first method in which the formation of a Ag alloy layer is required, a sputtering method is preferably applied to form a Ag alloy layer. Here, as the sputtering target for forming a Ag alloy layer by a sputtering method, it is preferable to apply a sputtering target including a Ag alloy containing Sn or Sb in an amount of 2.0 mass % or more and 9.5 mass % or less, in which crystal grains of the Ag alloy have an average grain size of 20 μm or more and 300 μm or less, and the relative standard deviation (variation) of the crystal grains is 20% or less relative to the average grain size.

In this sputtering target, with respect to the average grain size of the constituent crystal grains, a preferred grain size range is set, and, in addition to this, it is required that the variation in grain size among individual crystal grains is small. The reasons why these conditions are set are as follows. An average grain size of less than 20 μm causes an increase in production cost and is not realistic. Meanwhile, when the average grain size is more than 300 μm, at the time of sputtering, irregularities on the sputtered surface increase with the consumption of the target, whereby micro-arc discharge tends to increase. In addition, when the relative standard deviation (or variation) is more than 20% the average grain size, the thickness distribution in the target plane tends to be non-uniform.

The method for measuring the crystal grain size may be as follows, for example. An about 10-mm rectangular parallelepiped sample is extracted from an arbitrary part of the target plane of each sample and etched to expose the crystal grain boundary, and a photograph is taken under an optical microscope at a magnification of 60 or more and 120 or less. As the magnification of the photograph, a magnification that facilitates the calculation of the number of crystal grains is selected. In each photograph, a straight line is drawn in an arbitrary position in each of the longitudinal and transverse perpendicular directions, and the number of the crystal grains cut with each straight line is counted. The longitudinal and traverse dimensions of the photograph are each divided by the number of crystal grains, and the result is defined as an average grain size.

Advantageous Effects of the Invention

The electrode structure of a back electrode of a semiconductor substrate of the present invention described above has a multilayer structure Ti layer/Ni layer/Ag alloy layer, and, at the interface between the Ni layer and the Ag alloy layer, an intermediate region observed by a predetermined method is present. According to the present invention, in the back electrode of a semiconductor substrate, delamination of the Ag alloy layer from the Ni layer is less likely to occur. As a result, it becomes possible to stably actuate the device while maintaining the original function of each metal layer.

DESCRIPTION OF EMBODIMENTS

Figure 1:
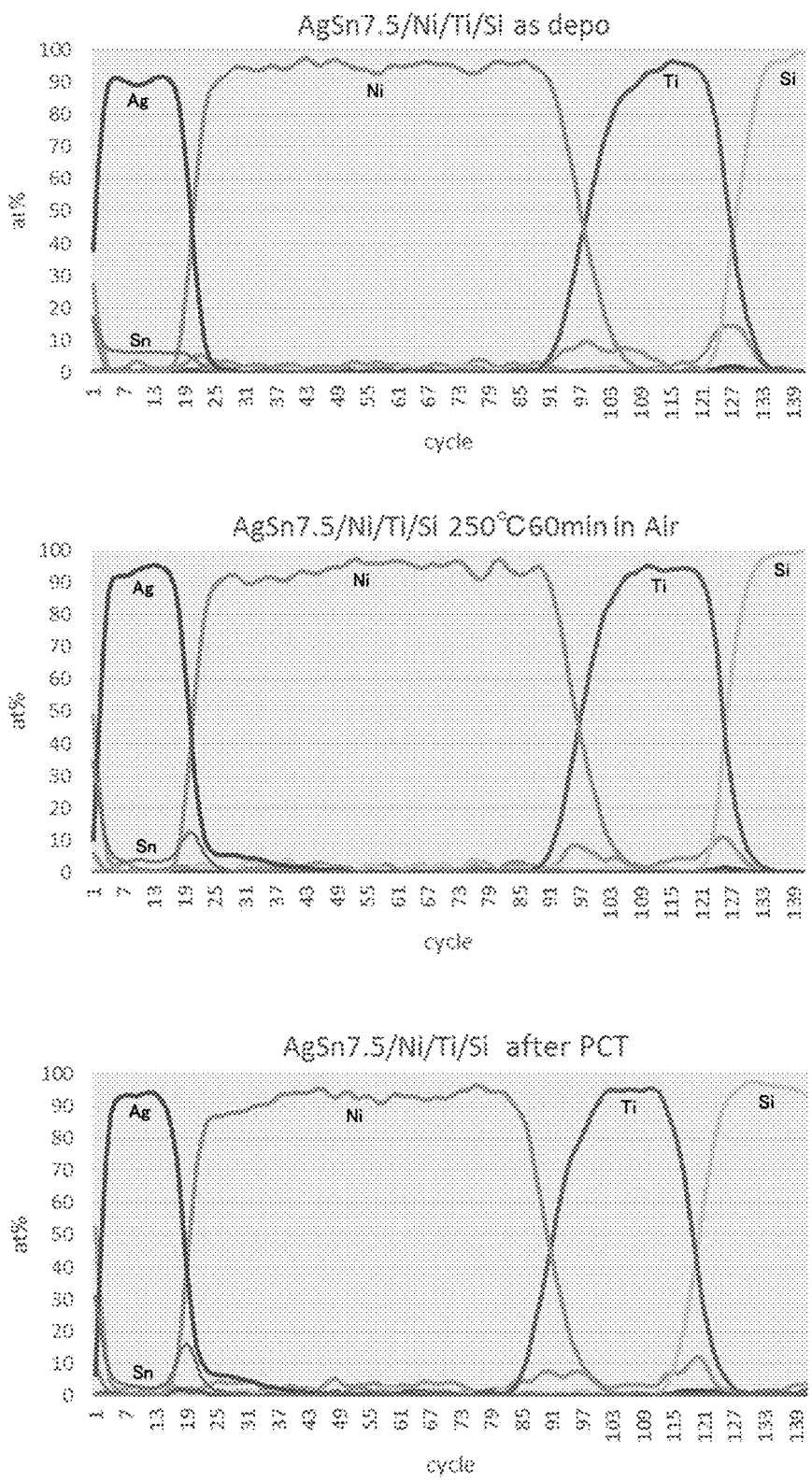
FIG. 1 shows the results of XPS analysis on a back electrode of Example 1 (Ti layer/Ni layer/Ag—Sn alloy layer) of the first embodiment.

Hereinafter, embodiments of the present invention will be described based on the following examples.

First Embodiment

In this embodiment, electrodes each having a multilayer structure Ti layer/Ni layer/Ag—Sn alloy layer (Examples 1 and 2) or Ti layer/Ni layer/Ag—Sb alloy layer (Example 3) were produced, and the configuration was examined. In each example, in the production of a multilayer-structured electrode, a silicon substrate (dimension: 20 mm×20 mm, 625 μm thick) was used as a substrate, and each metal layer was formed on the substrate by a sputtering method. For the formation of a Ti layer and a Ni layer, commercially available Ti target and Ni target having a purity of 99.9% were used. The thicknesses of the Ti layer and the Ni layer were 100 nm and 300 nm, respectively.

For the Ag alloy layer, the following targets were used: Ag-7.5 mass % Sn-alloy (Example 1), Ag-9.5 mass % Sn-alloy (Example 2), and Ag-5.0 mass % Sb alloy (Example 3). These targets had average grain sizes of 23.3 μm (Example 1), 164.6 μm (Example 2), and 30.5 μm (Example 3), respectively. In addition, in each target, it has been confirmed that the relative standard deviation of crystal grains is 20% or less relative to the average grain size. Then, by use of such a target, a 200-nm Ag alloy layer was formed.

After the formation of Ti layer/Ni layer/Ag alloy layer, a heat treatment was performed to form an intermediate region. As heat treatment conditions, at a temperature of 250° C., heating was performed in the atmosphere for 60 minutes. As a result of this heat treatment, an electrode having a three-layer structure Ti layer/Ni layer/Ag alloy layer including an intermediate region was produced.

Further, the multilayer-structured electrode of each example produced was subjected to XPS analysis to examine the configuration of the intermediate region. XPS analysis was performed on the electrode of each example in the following stages: immediately after the formation of the Ag alloy layer, after the heat treatment, and after the PCT test.

In the XPS analysis, PHI Quantera SXM (manufactured by ULVAC-PHI) was used as the analyzer, and the analysis conditions were as follows.

Measurement region: 500 μm×500 μm
Beam diameter: ϕ 100 μm
Measurement mode: Select "100μ, 20 W, 15 kV". In "Pulse Energy Selection", select "High 4".
Measurement time: Selected number of orbits of each designated element×four cycles Element designation: Ag (3d), Ni (2p), Ti (2p), Si (2p), C (1s), O (1s), Sn (3d5), Sb (3d5)
Sputtering conditions: Number of cycles: 140
Sputtering rate: 2 kV, 2 mm×2 mm
Sputtering time: 60 s/cycle The analytical data obtained under the above conditions was analyzed with an analysis software "Multipak" through the following procedures to prepare the profile of composition (at %).

(1) For every element, the background is withdrawn from the measurement data. At this time, the selected energy range [eV] of each element is designated to the following range.

Ag (3d): Two peaks are present near 368 eV (i) and near 374 eV (ii); designation is collectively made therefor. The designated range is the peak position of (i) −2 eV to the peak position of (ii) +3 eV.

Ni (2p): Designation is made only for the peak near 852 eV. The designated range is the peak position −2.0 eV to +2.5 eV.

Ti (2p): Designation is made only for the peak near 454 eV. The designated range is the peak position −1.0 eV to +3.0 eV.

Si (2p): Designation is made only for the peak near 99 eV. The designated range is the peak position ±1.0 eV.

C (1s): Designation is made only for the peak near 285 eV. The designated range is the peak position ±0.5 eV.

O (1s): Designation is made only for the peak near 530 eV. The designated range is the peak position ±0.5 eV.

Sn (3d5): Designation is made for the peak near 485 eV and the peak near 487 eV together. The designated range is the near-485 eV peak position −2.5 eV to the near-487 eV peak position +3.0 eV.

Sb (3d5): Designation is made for the peak near 528 eV and the peak near 530 eV together. The designated range is the near-528 eV peak position −2.5 eV to the near-530 eV peak position +3.5 eV.

(2) After designating the background range for each element, the designation is reflected in the measurement data to perform correction.

(3) From the corrected measurement data, at % is calculated.

(4) The calculation data is extracted, and the profile of composition according to the sputtering depth is prepared.

In this embodiment, the central part of the substrate (20 mm×20 mm) was subjected to analysis. Considering the measurement region at the time of analysis (500 μm×500 μm) and the sputtering conditions at the time of analysis (2 kV, 2 mm×2 mm) described above, for specifying the configuration of the back electrode according to the present invention, it is preferable to analyze one point per 10 mm×10 mm area. In the analysis of this embodiment, the etching mark as a result of sputtering is expected to reach about 5 mm×5 mm. Therefore, it can be considered sufficient to analyze one point (central part) per 10 mm×10 mm area.

Incidentally, also in actual semiconductor devices, substrates whose dimension is the same as or smaller than that of the substrate used in this embodiment are often applied. Therefore, in the case where the conditions are as above, it is expected to be preferable to perform the analysis on one arbitrary point of a substrate for a semiconductor device before dicing-processed.

Figure 2:
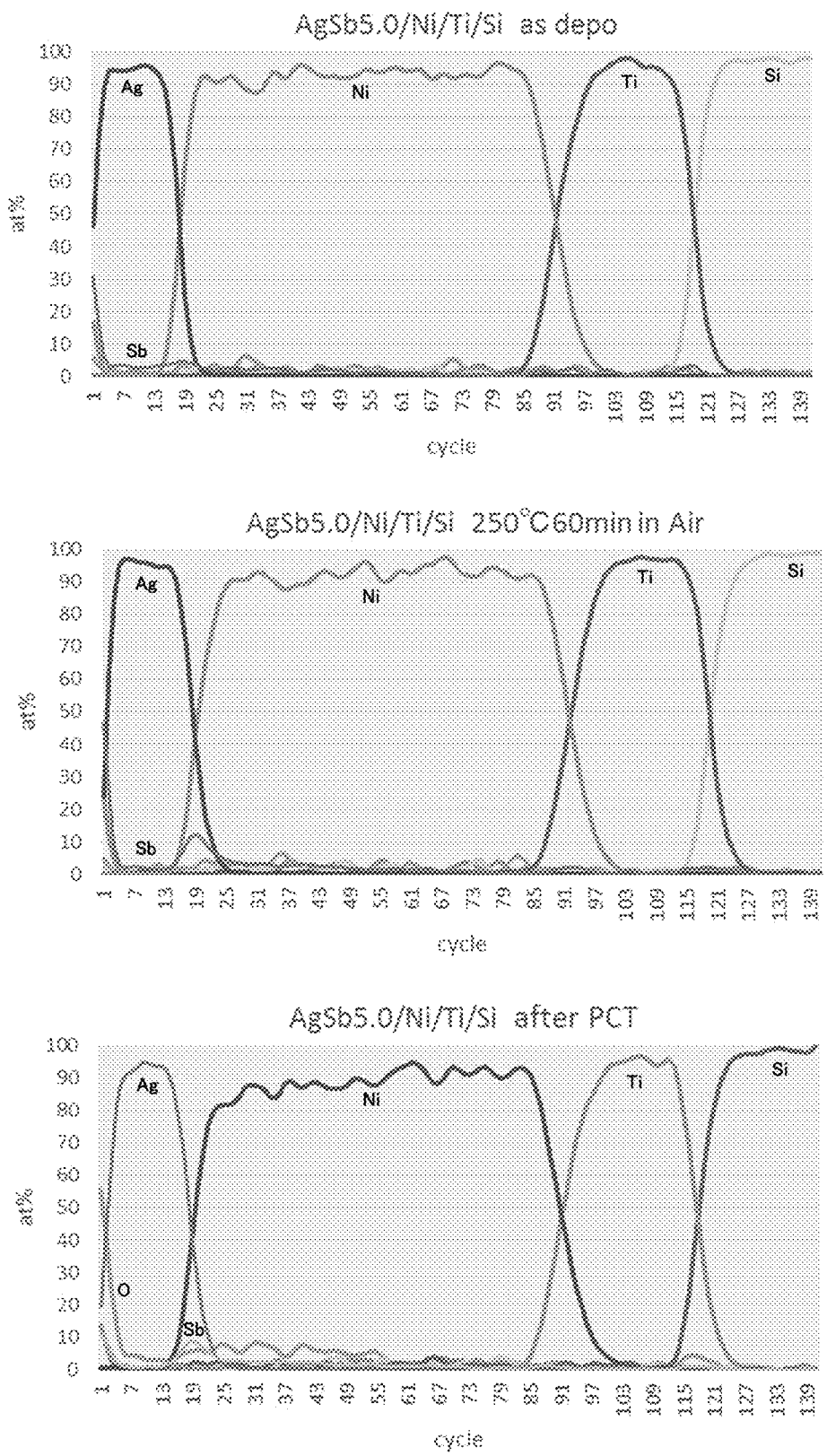
FIG. 2 shows the results of XPS analysis on a back electrode of Example 3 (Ti layer/Ni layer/Ag—Sb alloy layer) of the first embodiment.

The profile resulting from XPS analysis based on the analysis conditions described above (composition (at %) relative to the sputtering cycle (depth)) is shown in FIG. 1 (Example 1) and FIG. 2 (Example 3). With reference to the structure of Example 1 (Ti layer/Ni layer/Ag—Sn alloy layer) of FIG. 1, it can be seen that after the Ag alloy film formation, as a result of the heat treatment, a region containing elements Ni, Ag, and Sn, where the content of Sn has an approximately chevron-shaped peak, is formed at the interface between the Ni layer and the Ag alloy layer. This region is an intermediate region, and the peak (maximum) of the Sn content in this case is 12.7 at %. In this electrode of Example 1, a Ag alloy layer of a Ag-7.5 mass % Sn alloy (Ag-6.9 at % Sn alloy) is formed and then heat-treated to form an intermediate region. As a result of this heat treatment, the Ag alloy layer has become a Ag-4.0 at % Sn alloy, confirming compositional changes.

Further, from the profile of XPS, the thickness of the intermediate region of Example 1 was measured. The thickness of the intermediate region was calculated from the width of the region where all the elements Ni, Ag, and the addition element M were detected (the number of cycles) and the etching depth per cycle estimated for each metal. As a result, the thickness of the intermediate region of Example 1 was 80 nm, and it was confirmed that the thickness was within the preferred range (40 nm or more and 150 nm or less).

In addition, as shown in FIG. 2, similar results as in Example 1 were also observed in Example 3 (Ti layer/Ni layer/Ag—Sb alloy layer). The peak (maximum) of the content of the addition element M (Sb) in the intermediate region in Example 3 is 12.4 at %. In addition, in Example 3, a Ag alloy layer of a Ag-5.0 mass % Sb alloy (Ag-4.5 at % Sb alloy) was formed and then heat-treated to form an intermediate region. As a result of this heat treatment, the composition of the Ag alloy layer had changed to Ag-2.4 at % Sb. Further, the thickness of the intermediate region of Example 3 was calculated. As a result, it was confirmed that the thickness was 100 nm, that is, within the preferred range (40 nm or more and 150 nm or less).

Incidentally, also in Example 2 (Ti layer/Ni layer/Ag—Sn alloy layer), the composition and thickness of the intermediate region were measured. The peak (maximum) of the content of the addition element M (Sn) in the intermediate region of Example 2 was 21.9 at %. The thickness of the intermediate region was 80 nm.

Next, the electrode of each example was subjected to a PCT test (pressure cooker test: saturated pressurized vapor test), which is an accelerated heating test, and the adhesion of Ni layer/Ag alloy layer was evaluated. In the PCT test, a substrate having formed thereon the electrode was exposed to an atmosphere at a temperature of 120° C., a relative humidity (RH) of 100%, and 2 atm for 96 hours. Further, the electrodes after exposure were examined about the presence of Ag alloy layer delamination.

With respect to the back electrode of each example in this embodiment, the maximum of the content of the addition element M (Sn, Sb) in the intermediate region and the results of the PCT test (presence of delamination) are shown in Table 1.

TABLE 1

|  | Electrode structure | Addition element M Maximum | Intermediate region thickness | Delamination by PCT test |
|---|---|---|---|---|
| Example 1 | Ti/Ni/Ag—Sn | 12.7 at % | 80 nm | None |
| Example 2 |  | 21.9 at % | 80 nm | None |
| Example 3 | Ti/N/Ag—Sb | 12.4 at % | 100 nm | None |

As is clear from Table 1, the back electrode of each example has an intermediate region containing the addition element M in an amount of not less than 5 at %, which is the required amount. Further, it was confirmed that in the back electrode of each example, delamination of the Ag alloy layer does not occur even through the PCT test, and the adhesion to the Ni layer is excellent.

Further, in order to confirm the adhesion of the Ag alloy layer to the Ni layer, the peel strength of the Ag alloy layer was measured. For the measurement of peel strength, a "SAICAS NN" tester manufactured by Daipla Wintes Co., Ltd., was used. In this measurement, from the surface layer (Ag alloy layer) of the back electrode to the interface with the Ni alloy layer, cutting is performed at a low speed with a sharp cutting blade to peel off the surface layer. The horizontal and vertical forces applied to the cutting blade in this course and also the vertical displacement are measured, and the peel strength of the surface layer is calculated. In this embodiment, the following conditions were applied.

Measurement mode: Constant rate mode
Horizontal speed: 40 nm/sec
Vertical speed: 2 nm/sec
Cutting blade: Monocrystalline diamond (blade width: 0.3 mm, rake: 20°, clearance: 10°)

The peel strength was measured on the electrode of Example 2 (Ti layer/Ni layer/Ag—Sn alloy layer) after the PCT test. In addition, for comparison, a back electrode of conventional art, that is, a back electrode having the configuration Ti layer/Ni layer/Ag layer (after the PCT test) was also subjected to the same measurement. The results are shown in Table 2.

TABLE 2

|  | Electrode structure | Intermediate region thickness | Peel strength (after PCT) |
|---|---|---|---|
| Example 2 | Ti/Ni/Ag—Sn | 80 nm | 0.266 kN/m |
| Conventional Example | Ti/Ni/Ag | — | 0.052 kN/m |

As is clear from Table 2, in the back electrode in this embodiment, the peel strength of the Ag alloy layer is high, and the peel strength is four times that of the Ag layer of the conventional back electrode.

Second Embodiment

In this embodiment, a back electrode having applied thereto Pd as the addition element M (Ti layer/Ni layer/Ag—Pd alloy layer) was produced. In the production of this multilayer-structured electrode, first, a Ti layer and a Ni layer were formed by a sputtering method on the same substrate as in the first embodiment. The thicknesses of the Ti layer and the Ni layer were 100 nm and 300 nm, respectively.

Further, in this embodiment, a Pd thin film was formed on the surface of the Ni layer, and then a Ag alloy layer was formed, followed by a heat treatment, thereby forming an intermediate region and a Ag layer. In the Pd thin film formation and the subsequent Ag layer formation, a sputtering method was employed, and a 20-nm Pd thin film and a 500-nm Ag layer were formed.

After the formation of Ti layer/Ni layer/Pd thin film/Ag layer, a heat treatment was performed to form an intermediate region, thereby giving a back electrode. As heat treatment conditions, at a temperature of 250° C., heating was performed in the atmosphere for 60 minutes. As a result of this heat treatment, an electrode having a three-layer structure Ti layer/Ni layer/Ag alloy layer including an intermediate region was produced.

In the same manner as in the first embodiment, the back electrode according to this embodiment was also subjected to the PCT test and XPS analysis. The conditions of the XPS analysis were the same as in the first embodiment. However, in the designation of the analytical elements, Pd (3d) was also included in addition to Ag (3d), Ni (2p), Ti (2p), Si (2p), C (1s), and O (1s). In addition, in the analysis of measurement data, the selected energy range for background correction was as follows: Pd (3d): Designation is made for the peak near 335 eV and the peak near 340 eV together. The designated range was the near-335 eV peak position −2.5 eV to the near −340 eV peak position +5.0 eV.

Figure 3:
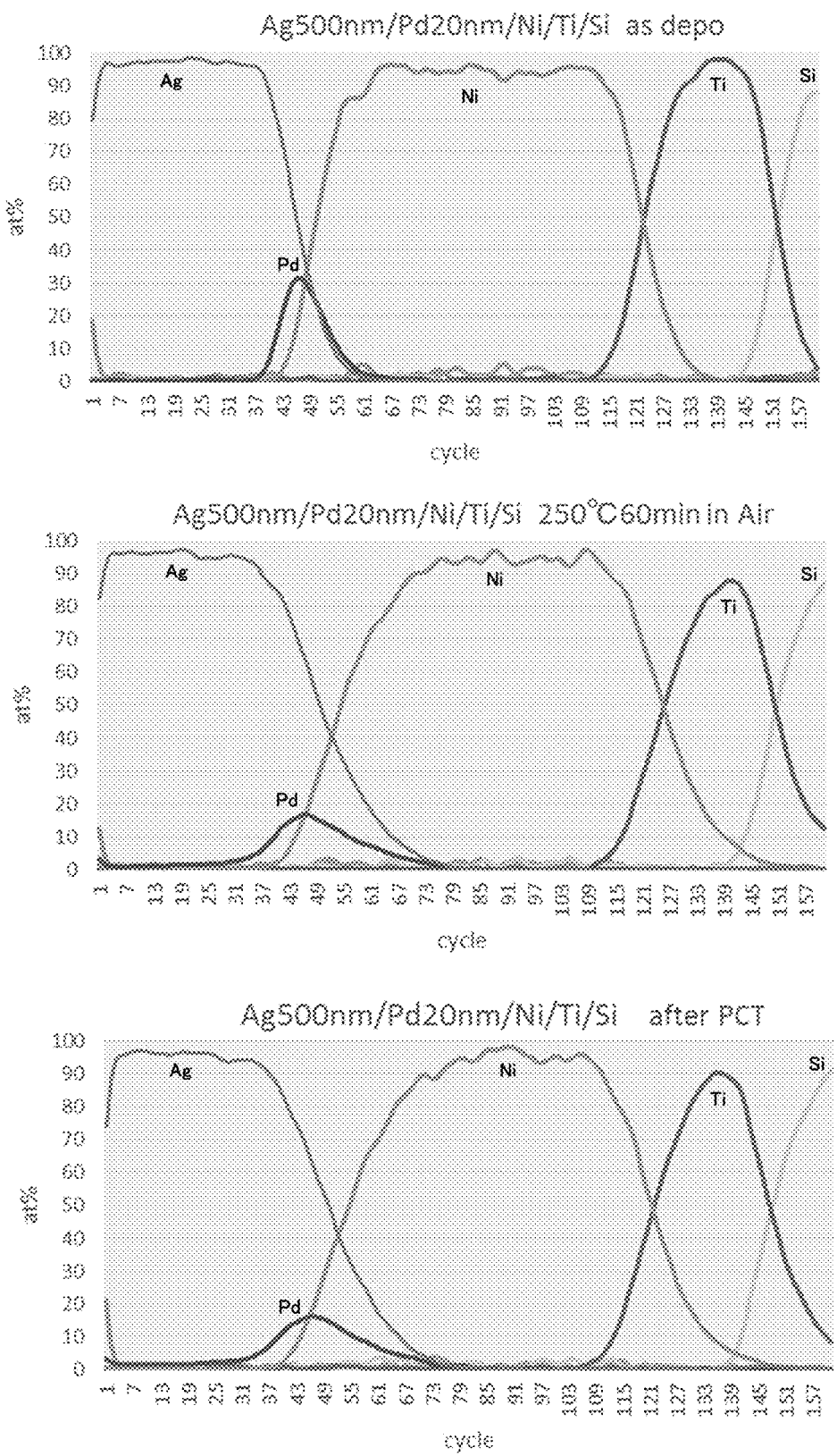
FIG. 3 shows the results of XPS analysis on a back electrode of the second embodiment (Ti layer/Ni layer/Ag—Pd alloy layer).

The results of the XPS analysis on the back electrode of the second embodiment are shown in FIG. 3. In the case of the electrode according to this embodiment, in the state from the Pd thin film formation to the Ag layer formation, a high peak of Pd is seen near the interface with the Ni layer. However, as a result of the heat treatment, the Pd content decreases, leading to a loose peak. Instead, Pd is diffused into the Ag layer, forming the Ag alloy layer. The peak of the Pd content in the intermediate region formed as a result of the heat treatment was 16.5 at %. The Ag alloy layer has the composition Ag-2.3 at % Pd. Further, the back electrode of this second embodiment was also confirmed to be in a favorable state without Ag alloy layer delamination after the PCT test.

Also in this embodiment, the thickness of the intermediate region was calculated based on the XPS analysis profile. As a result, the thickness of the intermediate region was calculated to be 80 nm. Also in this embodiment, the thickness of the intermediate region was within the preferred range (40 nm or more and 150 nm or less).

Third Embodiment

In this embodiment, a back electrode containing Sn as the addition element M and different in the intermediate region composition (the maximum of the content of the addition element M) was produced (Ti layer/Ni layer/Ag—Sn alloy layer). First, in the same manner as in the first embodiment, a Ti layer and a Ni layer were formed on a silicon substrate by a sputtering method. The thicknesses of the Ti layer and the Ni layer were 100 nm and 300 nm, respectively.

In this embodiment, the following targets were used: a Ag-5.0 mass % Sn alloy (Example 4), and a Ag-1.7 mass % Sn alloy (Comparative Example 1) for the formation of a Ag—Sn alloy layer. These targets have each been confirmed to have an average Ag alloy grain size within a range of 20 μm or more and 300 μm or less.

After the formation of Ti layer/Ni layer/Ag—Sn alloy layer, a heat treatment was performed in the same manner as in the first embodiment to form an intermediate region. As heat treatment conditions, at a temperature of 250° C., heating was performed in the atmosphere for 60 minutes.

Further, the electrodes of the example and the comparative example were each subjected to XPS analysis to measure the maximum Sn content in the intermediate region and the thickness of the intermediate region. In addition, in the same manner as in the first embodiment, a PCT test was performed, and the adhesion of Ni layer/Ag alloy layer was evaluated. The results are shown in Table 3. Incidentally, in Table 3, the results of Examples 1 and 2 of the first embodiment are also shown together.

TABLE 3

| | Electrode structure | Target composition | | Intermediate region | | Sn amount in Ag alloy layer (at %) | Delamination by PCT test |
|---|---|---|---|---|---|---|---|
| | | mass % | at % | Maximum Sn amount (at %) | Thickness (nm) | | |
| Example 1 | Ti/Ni/Ag—Sn | Ag-7.5 Sn | Ag-6.9 Sn | 12.7 | 80 | 4.0 | None |
| Example 2 | | Ag-9.5 Sn | Ag-8.7 Sn | 21.9 | 80 | 3.5 | None |
| Example 4 | | Ag-5.0 Sn | Ag-4.6 Sn | 6.2 | 100 | 3.5 | None |
| Comparative Example 1 | | Ag-1.7 Sn | Ag-1.5 Sn | 2.8 | 160 | 1.3 | Delamination occurred |

From Table 3, in the electrode of Comparative Example 1 to which a Ag alloy layer having a low concentration of the addition element M (Sn) was applied, the maximum of the Sn content in the intermediate region was also below the standard (5 at %). Further, as a result of the PCT test, delamination occurred. Meanwhile, in the intermediate region of Example 4, although the maximum of the Sn content was lower as compared with Examples 1 and 2, it was not below the standard value, and delamination did not occur.

INDUSTRIAL APPLICABILITY

The electrode structure of a back electrode of a semiconductor substrate according to the present invention has a multilayer structure Ti layer/Ni layer/Ag alloy layer, and exhibits excellent adhesion between the Ni layer and the Ag alloy layer. According to the present invention, it becomes possible to stably actuate the device while maintaining the function of each metal layer forming the back electrode. The present invention is expected to be applied to semiconductor devices, such as power modules including MOSFET and IGBT.

The invention claimed is:
1. An electrode structure of a back electrode formed on a back surface of a semiconductor substrate and having a multilayer structure including metal layers laminated in the following order from the semiconductor substrate: a Ti layer, a Ni layer, and a Ag alloy layer, wherein
the Ag alloy layer includes an alloy of Ag and an addition metal M selected from Sn and Sb,
when the back electrode is subjected to elemental analysis with an X-ray photoelectron spectrometer in a depth direction from the Ag alloy layer to the Ni layer, on a boundary between the Ni layer and the Ag alloy layer, an intermediate region where spectra derived from all the metals, Ni, Ag, and the addition element M, can be detected is observable, and further, when the content (at %) of each metal in the intermediate region is converted based on the spectra derived from all the metals Ni, Ag, and the addition element M, a maximum of the content of the addition element M is 5 at % or more.

2. The electrode structure of a back electrode according to claim 1, wherein the maximum of the content of the addition element M in the intermediate region is 7 at % or more.

3. The electrode structure of a back electrode according to claim 1, wherein the intermediate region has a thickness of 40 nm or more and 150 nm or less.

4. The electrode structure of a back electrode according to claim 1, wherein the Ag alloy layer is a Ag alloy containing the addition element M in an amount of 1.5 at % or more and 4.5 at % or less, and the Ag alloy layer has a thickness of 50 nm or more and 1000 nm or less.

5. The electrode structure of a back electrode according to claim 1, wherein the Ni layer has a thickness of 200 nm or more and 7000 nm or less.

6. The electrode structure of a back electrode according to claim 1, wherein the Ti layer has a thickness of 20 nm or more and 1000 nm or less.

7. A method for producing the electrode structure of a back electrode defined in claim 1, wherein the addition element M is Sn or Sb, the method comprises a step of forming a Ti layer on a back surface of a semiconductor substrate, a step of forming a Ni layer on the Ti layer, and a step of forming a Ag alloy layer including a Ag alloy containing Sn or Sb in an amount of 2.0 mass % or more and 9.5 mass % or less on the Ni layer, and the method further comprises, after forming the Ag alloy layer, a step of heating the substrate to 100° C. or more and 300° C. or less.

8. The electrode structure of a back electrode according to claim 2, wherein the Ni layer has a thickness of 200 nm or more and 7000 nm or less.

9. The electrode structure of a back electrode according to claim 2, wherein the Ti layer has a thickness of 20 nm or more and 1000 nm or less.

10. The electrode structure of a back electrode according to claim 2, wherein the intermediate region has a thickness of 40 nm or more and 150 nm or less.

11. The electrode structure of a back electrode according to claim 2, wherein the Ag alloy layer is a Ag alloy containing the addition element M in an amount of 1.5 at % or more and 4.5 at % or less, and the Ag alloy layer has a thickness of 50 nm or more and 1000 nm or less.

12. A method for producing the electrode structure of a back electrode defined in claim 2, wherein the addition element M is Sn or Sb, the method comprises a step of forming a Ti layer on a back surface of a semiconductor substrate, a step of forming a Ni layer on the Ti layer, and a step of forming a Ag alloy layer including a Ag alloy containing Sn or Sb in an amount of 2.0 mass % or more and 9.5 mass % or less on the Ni layer, and the method further comprises, after forming the Ag alloy layer, a step of heating the substrate to 100° C. or more and 300° C. or less.

* * * * *